United States Patent [19]

Overweg et al.

[11] Patent Number: 4,931,735
[45] Date of Patent: Jun. 5, 1990

[54] SUPERCONDUCTIVE MAGNET SYSTEM COMPRISING SUPERCONDUCTIVE CYLINDERS

[75] Inventors: Johannes A. Overweg; Paul B. Bunk, both of Eindhoven, Netherlands

[73] Assignee: U.S. Philips Corporation, N.Y.

[21] Appl. No.: 347,599

[22] Filed: May 2, 1989

[30] Foreign Application Priority Data

May 4, 1988 [NL] Netherlands .......................... 8801162

[51] Int. Cl.⁵ ........................................... G01R 33/20
[52] U.S. Cl. .................................... 324/318; 505/844; 324/320
[58] Field of Search ................ 505/844; 324/300, 307, 324/309, 318, 319, 320, 322; 128/653

[56] References Cited

U.S. PATENT DOCUMENTS

| | | | |
|---|---|---|---|
| 4,636,730 | 1/1987 | Bottomley | 505/844 |
| 4,642,569 | 2/1987 | Hayes et al. | 505/844 |
| 4,689,563 | 8/1987 | Bottomley et al. | 324/309 |
| 4,694,254 | 9/1987 | Vatis et al. | 324/322 |
| 4,695,802 | 9/1987 | Zijlstra | 324/319 |
| 4,736,161 | 4/1988 | Prevot et al. | 324/318 |

*Primary Examiner*—Michael J. Tokar
*Attorney, Agent, or Firm*—William Squire

[57] ABSTRACT

In a magnetic resonance apparatus a system of concentric cylinders of superconductive material maintain an effective steady magnetic field in a measured space within the inner cylinder which field is very homogeneous and is, moreover, very constant in time without requiring a large electric power. In a particular embodiment a magnetic field cylinder produces a strong magnetic field, a stabilization cylinder within the magnetic field cylinder ensures a good homogeneity and stabilization of the effective magnetic field, while a screening cylinder provided outside the magnetic field cylinder reduces the external stray field of the system.

20 Claims, 2 Drawing Sheets

SUPERCONDUCTIVE MAGNET SYSTEM COMPRISING SUPERCONDUCTIVE CYLINDERS

BACKGROUND OF THE INVENTION

1. Field of the Invention

The invention relates to a magnetic resonance apparatus comprising a superconductive magnet system for generating a steady magnetic field in a measuring space and to a magnet system for such an apparatus.

2. Prior Art

A superconductive magnetic resonance apparatus is disclosed in EP 138270 corresponding to commonly owned U.S. Application Ser. No. 657,636, filed Oct. 4, 1984. In this specification an apparatus is described having two coil systems which are arranged coaxially in the radial direction for generating a homogeneous interference-free magnetic field in a measuring space with stray field compensation by activation of the outer coil system.

For generating strong stationary magnetic fields in mr-apparatus, use is preferably made of superconductive magnetic coils, in particular when high requirements are imposed, for example, on the stability of the field to be generated. The superconductive coil customarily consists of a solenoid or a number of coaxial coils. The magnetic field is then directed along the axis of a cylinder formed by the coils and is usually rotationally symmetrical.

For reaching a very constant field a persistent mode is usually utilized in which the terminals of such a magnetic coil are short-circuited after a desired electric current through the coil is established by a power supply source. In this persistent mode the electric current through the coil remains substantially constant; only a small residual resistance of the coil can lead to a gradual decrease of current in time. The shape of the field of such a coil is mainly determined by the shape of the coil system. For correcting for deviations of the field from the shape in view as a result of inevitable manufacturing tolerances in the coil, use is generally made of superconductive or non-superconductive correction coils or of pieces of a magnetic material.

Such coils are usually wound from a wire in which the superconductive material is an alloy of the element niobium. Since the superconductive transition temperature of the said materials generally is well below 25K, such magnets are usually cooled with liquid helium or helium gas which is cooled by means of a cooling machine to a temperature of, for example, a few degrees above absolute zero.

In a magnet coil for generating a comparatively strong field, for example, at least 1 tesla, in a sufficiently large measuring space a large number of ampere turns of this wire are necessary and interruption somewhere in the wire may cause complete disturbance of the operation.

In addition to the above-mentioned niobium alloys a class of superconductive materials has recently become known which will briefly be referred to hereinafter as "ceramic superconductors". These materials are characterized in particular by a transition temperature which is significantly higher than 25K and a specific heat which is comparatively high also in the superconductive state.

Such materials can be brought in the superconducting state with a minimum of cooling means, as a result of which both construction and exploitation of a large superconductive magnet could become easier and cheaper. Unfortunately, the ceramic superconductors also have a few properties which makes them seem less suitable for use in a superconductive magnet system. The maximum permissible current density at which these materials are still reliably superconductive is often restricted. As a result of this, a large conductor cross-sectional area is desired for a large magnet. Furthermore, the ceramic superconductors are brittle and hence difficult to process to wire. In particular in magnets in which the stability of the field is important, said brittleness is a problem because any interruption in a desired superconductive short-circuited circuit will lead to an increase of the electric resistance and hence to a decrease of the current intensity and possibly to local heating which may rapidly expand by a further transition from the superconductive state.

SUMMARY OF THE INVENTION

It is the object of the invention avoid the said drawbacks and restrictions and for that purpose a magnetic resonance apparatus of the type mentioned in the opening paragraph is characterized in that the superconductive magnet system is built up from one or several cylindrical rings of superconductive material which are short-circuited or closed in themselves.

In a magnetic resonance apparatus according to the invention a coil wound from thin wire is replaced by a superconductive circuit in the form of a cylindrical ring or band which is short-circuited or closed in itself. A superconductive ring or cylinder keeps the enclosed magnetic field constant. If at the moment at which the cylinder is brought in the superconductive state no magnetic field were present, said field will remain absent even if subsequently a magnetic field is applied outside the cylinder. Conversely, if a field is present during the becoming superconductive the cylinder will maintain said field even if the external field is changed or switched off. This phenomenon is known as the "freezing-in" of a magnetic field. Since the superconductive material now has the shape of a continuous cylinder surface or ring coating, the drawback of local quenching is avoided since juxtaposed superconductive material takes over the current without any difficulty. Due to the comparative instability of niobium superconductors, these pass to the normal (resistive) state already at comparatively low current densities. An important factor which contributes to this instability is the very low specific heat of the said materials in the superconductive state. This stability problem can be avoided only by using the niobium alloy in the form of thin wires enclosed in a sheath of electrically conductive material, for example, copper.

With the ceramic superconductors the problem of a spontaneous transition to the normal state is much smaller in particular also because at the higher temperatures at which the said materials are still superconductive the specific heat is many times larger than in the very low temperatures for niobium alloys. This makes it more attractive to use the said superconductive materials for the field-freezing-in method for large systems.

In a preferred embodiment the superconductive magnet system is formed by a single magnetic field cylinder from a superconductive material incorporated in a dewar having such a thermal insulation that the cylinder can be brought and maintained at a transition temperature for superconductivity. In order to be able to generate a magnetic field with this system, an auxiliary coil is used which is moved into the magnetic field cylinder or around it. The auxiliary coil may be the conventional coil which is wound, for example, from copper wire but may also be a superconductive coil which is cooled to below the transition temperature. With the measuring field cylinder in the normal state an auxiliary coil is adjusted at a desired field strength. When that is reached the magnetic field cylinder is cooled to below the transition temperature. When the current in the auxiliary coil is then switched off such a current is induced into the cylinder that the field within the magnetic field cylinder is maintained. When the auxiliary coil is present within the magnetic field cylinder the resulting field, dependent on the coupling factor, will be slightly smaller, it is true, than the original field of the auxiliary coil, but this can a priori not be taken into account. Since the freezing-in of the field can be done in a short period of time it is not necessary to design the auxiliary coil for continuous operation, in many cases a cooling system therefor will hence not be necessary. As soon as the current in the auxiliary coil has been reduced to zero it may be removed from the magnetic field cylinder. If the auxiliary coil is not short-circuited, no large electro magnetic forces need be overcome. The superconductive material of the magnetic field cylinder preferably is a ceramic superconductive material which is provided, for example, on a carrier.

Because the ultimate shape of the frozen-in field is also influenced by magnetic fields originating from sources outside the coil system a further preferred embodiment comprises, in order to avoid this, a second cylinder having a larger diameter which is provided as a screening cylinder around the superconductive magnetic field cylinder with which the field is frozen-in. It is desirable to bring the screening cylinder in the superconductive state in the absence of disturbing magnetic fields. If the cylinders can simply be transported at a temperature below the transition temperature, the freezing-in of a field-free region within the screening cylinder may be done at another site than at the site where the system is ultimately installed. If a superconductive screening cylinder is present said screening operates in two directions, namely, interfering external fields are screened from the measuring field in which a readily defined magnetic field is desired and, second the surroundings are screened from stray fields which are generated by the innermost cylinder.

For an efficient use of material and to avoid irregularities which might occur if the electric currents which are induced in the superconductive cylinders are so large that as a result of this the critical current density of the materials used is approached, which can comparatively easily occur in particular with some ceramic superconductors, the local cross-sectional area of the superconductive cylinders will have to be made sufficiently large. Since the current distribution over the cylinder in the axial direction need not be homogeneous, a homogeneous load of the material may be ensured by giving the layer of superconductive material a locally adapted thickness, which means in this case a current density which is as uniform as possible and has a value which lies, for example a given margin below the critical current density. Since the critical current density depends on the local magnetic field strength, thickness adaptation may also be taken into account.

If the provision of the superconductive layer of a sufficient thickness is restricted for technical or economical reasons, the cylinder may be replaced by a stack of rings which are flat in the axial direction on which one or at each axial end one, layer of superconductive material short-circuited or closed in itself is provided. The freezing-in of a magnetic field in such a system of short-circuited rings may be carried out in the same manner as described hereinbefore. For adapting the cross-section to superconductive material the layer thickness of the superconductive material or, when a uniform layer thickness is used, the thickness of the supporting rings, may be varied in the axial direction of the cylinder.

Superconductors usually have a certain residual resistance which depends in particular on the ratio of the actual current density to the critical current density. The residual resistance increases according as the current in the superconductor is larger. If the critical current density is closely approached, a comparatively large drift in the strength of the frozen-in magnetic field may occur. This drift can be restricted by providing a third superconductive cylinder within the magnetic field cylinder which generates the desired field. If the said stabilisation cylinder is brought in the superconductive state only after the field of the auxiliary coil has been switched off, the current induced herein will for the time being be small. By increasing the current in the stabilisation cylinder drift loss as a result of current decrease in the magnetic field cylinder will from that instant on, be compensated for.

A stabilisation cylinder may also be used for improving the site-dependence of the field in the measuring space. At the instant the field of the auxiliary coil has been frozen-in and the current in the auxiliary coil has been switched off, the resulting magnetic field will possibly deviate from, for example, a desired homogeneity. These deviations may be corrected for by means of correction coils which may form part of an auxiliary coil system. When the desired field correction has been adjusted it can be maintained by bringing the stabilisation cylinder in the superconductive state. The correction coils may then be removed from the system. The auxiliary coil system may comprise, in addition to correction coils, measuring coils for local field measurement.

A magnetic resonance apparatus comprises a system of gradient coils for the selection of areas to be displayed. They will preferably be placed within the superconductive system. The drawback of known superconductive magnets is the occurrence of the effect of eddy currents which can be induced by the said gradient coils, for example, in components of the thermal insulation of the superconductive magnet. In a preferred embodiment this drawback has been avoided in that no electrically conductive walls are incorporated between the innermost superconductive cylinder and the gradient coil system. The gradient coils will induce currents in the superconductive cylinder but these have no exponential decay in time as a result of which the known drawbacks for the image formation do not occur. In designing the gradient coils the constant effect of the superconductive cylinder may be taken into account. It may be necessary to optimise the innermost superconductive layer for an optimum alternating current behaviour.

BRIEF DESCRIPTION OF THE DRAWING

A few embodiments according to the invention will now be described in greater detail with reference to the drawing, in which.

DETAILED DESCRIPTION OF THE PREFERRED EMBODIMENTS

Figure 1:
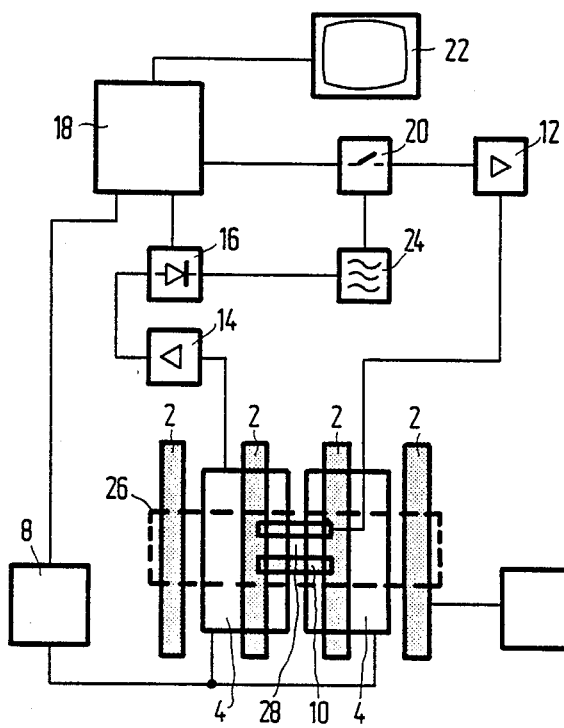
FIG. 1 shows a magnetic resonance apparatus.

A magnetic resonance apparatus as shown in FIG. 1 comprises a superconductive magnet system 2 for generating a stationary magnetic field, magnet coils 4 for generating a gradient field, a supply source 6 for the magnet system 2 and a supply source 8 for the gradient coil 4. An rf coil system 10 serves, for example, both for generating a radio frequency pulsated magnet field and for detecting nuclear magnetic resonance generated in an object to be measured by the radio frequency field. Upon transmitting the rf coil system 10 is connected to a radio frequency source 12. During detecting the coil system 10 is connected to a detection amplifier 14. The amplifier 14 is connected to a rectifier 16 which is connected to a central control device 18. The central control device 18 further controls a modulator 20 for the radio frequency source 12, the supply source 8 for the gradient field and a monitor 22 for imaging. A high frequency oscillator 24 controls both the modulator 20 for the radio frequency source 12 and the phace-sensitive rectifier 16 processing the measured signals.

Figure 2:
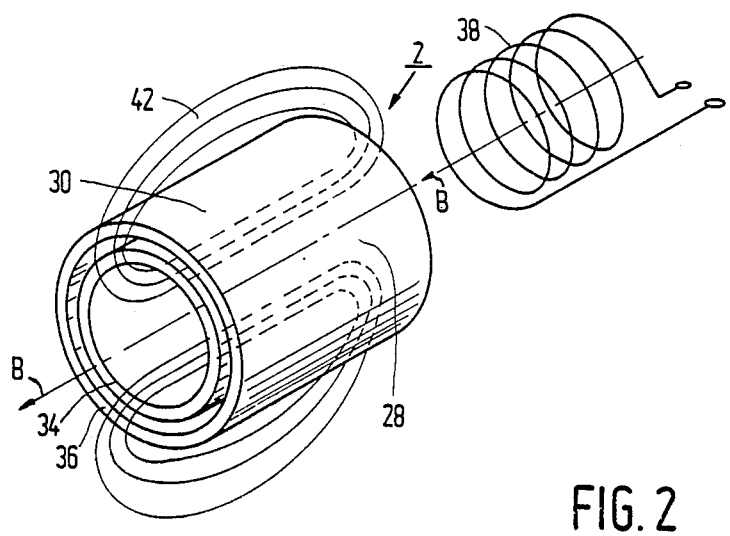
FIG. 2 shows a superconductive magnet system therefor with a few superconductive cylinders.

FIG. 2 shows a magnet system 2 in its simplest form consisting of a single cylinder 30 of a superconductive material. Such a cylinder has a diameter of, for example, 1.0 meter and a length of, for example, 1.2 meter. The superconductive material forms a closed cylinder surface 34. Because it is often difficult to form a self-supporting cylinder from superconductive material first a carrier cylinder 36 has been formed for making the coil, for example, of metal, but also of ceramic material or a synthetic resin. The wall thickness of the supporting cylinder is, for example, a few millimeters and the thickness of the superconductive material is uniform over the whole cylinder surface, or, viewed in the axial direction, varies locally, adapted to a maximum permissible superconductive current density with a safety margin therebelow. In order to prevent field influencing by the carrier in a measuring space 28 as much as possible it is favourable to provide the superconductive material on an inside of the supporting cylinder, but this is not necessary also dependent on the selective carrier material. It may also be favourable to provide a layer of a superconductive material on both surfaces of the carrier cylinder. The carrier cylinder, depending on the construction, may also have the function of a cold conductor, for example, for more rapid and more uniform cooling or heating the superconducting material, but may also serve as a thermal insulator, for example, when it is desired in a double coating that one of the two superconductive cylinders is temporarily superconductive and the other one is not yet superconductive. This situation can also be realised by using cylinders of a superconductive material with mutually different transition temperatures. In order to reduce the risk of undesired local transition from the superconductive state, usually termed quenching, it is favourable for the current density in the superconductive material to be uniform. Since the required current distribution in the cylinder surface for a desired field distribution in the measuring space is known, the uniformity in the current density can be optimised by adapting the thickness. If the quenching temperature locally drops as a result of, for example, the strength of a locally present magnetic field, this may also be taken into account by varying the thickness. For the activation of such a coil an auxiliary coil 38 may be used which in fact does not form part of the magnet system but only has the function of activation. For this purpose the auxiliary coil 38 is provided in or around the magnetic field cylinder 30 and is then activated in such a manner that a desired magnetic field B enclosed by the cylinder is generated. The superconductive magnetic field cylinder or cylinders is or are then cooled to the superconductive state after which the auxiliary coil is removed. The magnetic field B has now been frozen-in by the superconductive magnetic field cylinder and is maintained therein by persisting circular currents in the cylinder surface. By activating only then further elements of the resonance apparatus it may be prevented that accidentally present interference fields are also frozen-in and would interfere with a desired field distribution, for example, the desired homogeneity of the field.

Figure 3:
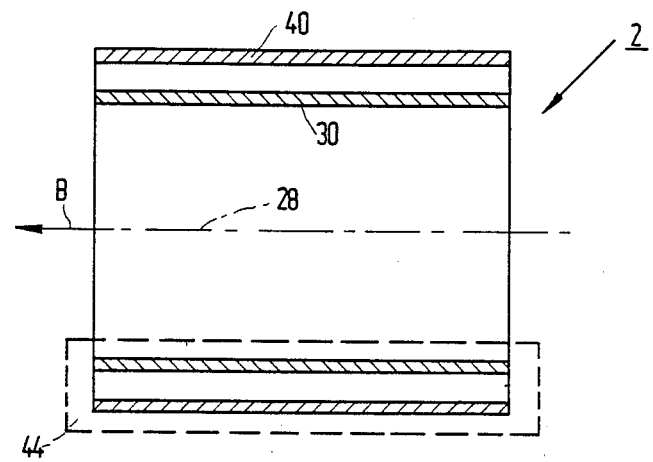
FIG. 3 shows a superconductive magnet system therefor equipped with a superconductive screening cylinder.

A magnet system 2 as shown in FIG. 3 again comprises a superconductive magnetic field cylinder 30. Around said cylinder is provided a superconductive screening cylinder 40 by means of which a stray field 42 (FIG. 2) of the magnetic field cylinder 30 is substantially confined between the two cylinders, so that the space radially outside the two cylinders can be made substantially stray field free and the extent of the stray field in the axial direction is also reduced. Like the cylinder 30 shown in FIG. 2, the magnet system shown in FIG. 3 is also incorporated in a thermally insulating housing 44 which is shown diagrammatically in the drawing and encloses the magnet system cylindrically in such a manner that the measuring space 28 remains free and accessible. When a ceramic superconductive material is used, a cooling to, for example, approximately 100K will suffice so that, for example, liquid nitrogen may be used and the cooling system may be very simple, compact and cheap. Cooling may then be carried out in a comparatively simple manner with, for example, a cooling machine having a thermally insulated good thermal conductivity towards the superconductive material or by a gas or liquid flow circulating therefrom. For materials which only become superconductive above room temperature, the magnet system in the housing 44 may be heated before providing in the non-superconductive state.

Figure 4:
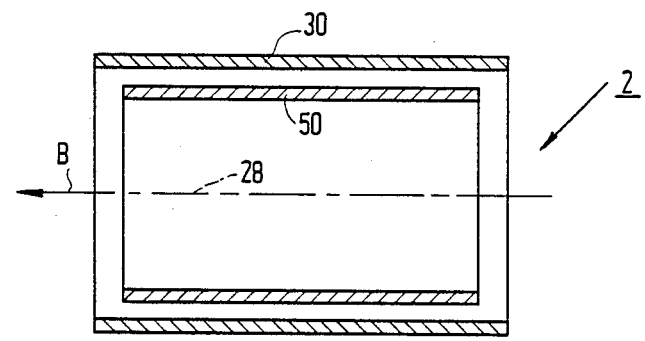
FIG. 4 shows a superconductive magnet system therefor equipped with a superconductive stabilisation cylinder.

FIG. 4 shows an embodiment of a magnet system 2 in which a superconductive stabilising cylinder 50 is incorporated within the field cylinder 30. The advantage of a stabilisation cylinder is that variations in the persisting currents in the magnetic field cylinder can be compensated thereby, for example, the slow decrease of the field cylinder current by an occurring residual resistance or by local quenching. Corrections may also be made in the field of the field cylinder by means of the stabilisation cylinder, both for inhomogeneities in the persisting currents therein and for wrongly frozen-in fields. A further practical advantage is that the field cylinder can now be loaded comparatively high since some drift in the persisting current is permissible and complementary currents need not be incorporated. Compared with the field cylinder, comparatively little superconductive material will suffice for the stabilision cylinder since no strong persisting currents will be generated therein. The stabilising superconductive cylinder may again be placed in the field cylinder as a self-supporting cylinder or in the form of a surface coating on a carrier cylinder. The stabilisation cylinder may also be formed by an already mentioned inner surface coating of the cylinder 30. In particular, the systems according to FIGS. 3 and 4 are combined to form a screening stabilised magnetic system thus having three superconductive cylinders.

Figure 5:
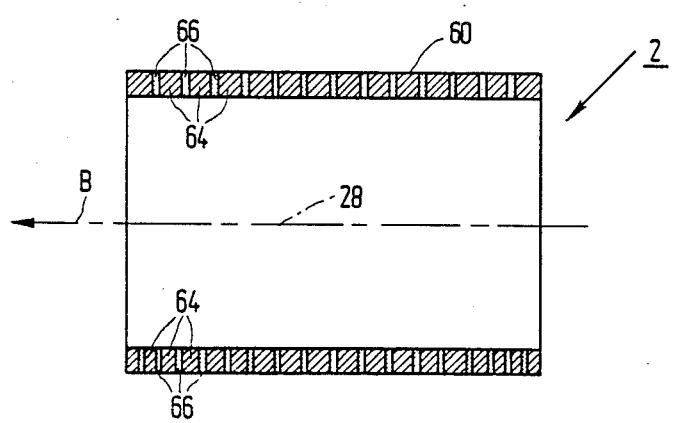
FIG. 5 shows a superconductive magnet system therefor having several axially stacked flat superconductive rings.

An embodiment as shown in FIG. 5 comprises a magnet system 2 having one or more superconductive cylinders 60 built up from flat rings 62 each consisting of a carrier 64 coated on each side with a layer of superconductive material 66 but which may of course also be covered on one side only. More superconductive material may be incorporated over the same axial length as a result of which superconductive material having a comparatively low maximum permissible current density may also be used and on the other hand superconductive material which can be provided only in comparatively thin layers may also be used. To be considered are rings which are to be made individually and are then to be stacked but a cylinder constructed from superconductive material alternated by carrier material provided on a starter ring may also be considered. A magnetic field cylinder 60 as shown may again form a magnetic system as shown in FIG. 2 but these cylinders may also form part of magnetic systems as shown in FIGS. 3 and 4. In this case also the current density for the superconductive material may be uniformed by thickness variations measured in the axial direction or be adapted to local field strength. The latter may now also be realised by varying the axial thickness of the carrier rings or the superconductive rings or both in the axial direction of the cylinder as is shown in a lower side of FIG. 5 as a result of which an axial locally varying cross-section of superconductive material has again been realised.

For measuring the field distribution in the measuring space known measuring devices may also be used, but these may also form part of the auxiliary cylinder 38 which then is constructed to be placed around the field cylinder. The stabilisation cylinder is made superconductive only when the measuring coils measure a correct field distribution. By making the stabilisation cylinder superconductive the correct field is then frozen-in. In particular the stabilisation cylinder may also be of use to avoid field disturbances as a result of eddy currents which might be generated by gradient coils to be added to the magnet system. With the field correction the compensation currents necessary therefore may be taken into account because they are no longer time dependent as persistent currents.

We claim:

1. A magnetic resonance apparatus having a superconductive magnet system for generating a stationary magnetic field in a measuring space, comprising a magnetic field cylinder including at least one short-circuited ring of a superconductive material.

2. A magnetic resonance apparatus as claimed in claim 1, characterized in that the short-circuited ring of the magnetic field cylinder is formed of the superconductive material as a closed ring on a carrier.

3. A magnetic resonance apparatus as claimed in claim 1, characterized in that the magnetic field cylinder comprises a tubular carrier cylinder coated on opened surface sides with superconductive material.

4. A magnetic resonance apparatus as claimed in claim 1, characterized in that the magnetic field cylinder is built up from a series of axially stacked flat carrier rings coated with a superconductive material.

5. A magnetic resonance apparatus as claimed in, claim 1, characterized in that in addition to the magnetic field cylinder the magnetic system comprises a superconductive screening cylinder present coaxially around said magnetic field cylinder.

6. A magnetic resonance apparatus as claimed in claim 1, characterized in that the magnet system comprises a superconductive stabilisation cylinder mounted coaxially within the magnetic field cylinder.

7. A magnetic resonance apparatus as claimed in claim 6, characterized in that the stabilising cylinder is designed for compensation of field deviations of a field generated by the magnetic field cylinder.

8. A magnetic resonance apparatus as claimed in claim 6, characterized in that the stabilisation cylinder screens the magnet system from field disturbances of gradient coils of said magnetic resonance apparatus.

9. A magnetic resonance apparatus as claimed in claim 6, characterized in that the stabilization cylinder is formed by a layer of a superconductive material provided on an inside of a carrier cylinder for the magnetic field cylinder.

10. A magnetic resonance apparatus as claimed in claim 1, characterized in that the superconductive material of the magnetic field cylinder has a layer thickness which varies in the axial direction of the cylinder.

11. A magnetic resonance apparatus as claimed in claim 4, characterized in that the thickness of the superconductive coating and/or of the carrier rings varies in the axial direction of the cylinder.

12. A magnetic resonance apparatus as claimed in claim 1, characterized in that the superconductive material is at least partially ceramic superconductive material.

13. A magnetic resonance apparatus as claimed in claim 2, characterized in that the carrier is constructed as a cooling conductor for cooling superconductive material.

14. A magnetic resonance apparatus as claimed in claim 1, characterized in that superconductive material of the magnet system can be cooled from outside the magnet system.

15. A magnetic resonance apparatus as claimed in claim 14, characterized in that the superconductive material can be cooled with a circulating flow of cooling medium.

16. A magnetic resonance apparatus as claimed in claim 14, characterized in that the superconductive material can be cooled via heat conducting connections between an external cooling material and the superconductive material.

17. A magnet system for a magnetic resonance apparatus comprising a cylindrical carrier and a closed ring of superconductive material formed on the surface of said carrier.

18. A magnetic resonance apparatus as claimed in claim 1 further comprising magnetic means for inducing a persistent current in said ring.

19. A magnetic resonance apparatus as claimed in claims 2, characterized in that in addition to the magnetic field cylinder the magnetic system comprises a superconductive screening cylinder present coaxially around said magnetic field cylinder.

20. A magnetic resonance apparatus as claimed in claim 19, characterized in that the magnet system comprises a superconductive stabilisation cylinder mounted coaxially within the magnetic field cylinder.

* * * * *